United States Patent [19]

Kubota et al.

[11] Patent Number: 4,988,605

[45] Date of Patent: Jan. 29, 1991

[54] LIGHT-SENSITIVE RESIN COMPOSITION AND LIGHT-SENSITIVE ELEMENT

[75] Inventors: Shigeru Kubota; Katsue Masui; Toshimoto Moriwaki; Torahiko Andou, all of Hyogo, Japan

[73] Assignee: Mitsubishi Denki Kabushiki Kaisha, Tokyo, Japan

[21] Appl. No.: 329,893

[22] PCT Filed: Jul. 5, 1988

[86] PCT No.: PCT/JP88/00669

§ 371 Date: Mar. 2, 1989

§ 102(e) Date: Mar. 2, 1989

[87] PCT Pub. No.: WO89/00586

PCT Pub. Date: Jan. 26, 1989

[30] Foreign Application Priority Data

Jul. 9, 1987 [JP] Japan .................. 62-171476

[51] Int. Cl.$^5$ ............................................. G03C 1/492
[52] U.S. Cl. ................................... 430/270; 430/284; 522/95; 525/127; 525/58
[58] Field of Search ................ 430/284, 270; 525/127, 525/58; 522/95

[56] References Cited

U.S. PATENT DOCUMENTS

| | | | |
|---|---|---|---|
| 4,544,625 | 10/1985 | Ishimaru et al. | 430/284 |
| 4,717,740 | 1/1988 | Hung et al. | 430/284 |
| 4,753,860 | 6/1988 | Hung et al. | 430/284 |
| 4,849,321 | 7/1989 | Hung et al. | 430/284 |

FOREIGN PATENT DOCUMENTS 60-250023 12/1985 Japan .
61-31330 1/1986 Japan .
61-278521 12/1986 Japan .

*Primary Examiner*—Jack P. Brammer
*Attorney, Agent, or Firm*—Wolf, Greenfield & Sacks

[57] ABSTRACT

The present invention relates to a light-sensitive resin composition that has resistance to heat and chemicals, is particularly adapted for use in the formation of a protective film for chemical plating and which is also improved in resistance to the heat of soldering. This light-sensitive resin composition contains (a) a polyurethane (meth)acrylate, (aa) a bisphenol type epoxy (meth)acrylate, (b) a linear high-molecular weight compound, and (c) a polymerization initiator which generates free radicals upon exposure to light. This resin composition is applicable to the manufacture of printed circuit boards by the additive process.

6 Claims, No Drawings

LIGHT-SENSITIVE RESIN COMPOSITION AND LIGHT-SENSITIVE ELEMENT

TECHNICAL FIELD

The present invention relates to a light-sensitive resin composition and a light-sensitive element that have resistance to heat and chemicals and which have good enough characteristics to be used in such applications as the fabrication of printed circuit boards and which are also suitable for use in the formation of solder masks and protective films for chemical plating.

BACKGROUND ART

Solder masks are applied in soldering processes for various purposes including delineation of areas to be soldered, protection of copper conductors against corrosion and retention of electrical insulation between conductors. Conventionally, solder masks have been prepared by screen printing of thermosetting resins typified by epoxy resins. However, as the line width required of circuit patterns is decreasing, satisfactory levels of precision are no longer attainable by the screen-printing method and it has become necessary to adopt a photomechanical process in order to obtain fine patterns. In addition, with any improvement in wiring density, even higher reliability is required of the insulation between conductors and the requirements for satisfying this need have become increasingly regorous. It is difficult to form a thick coating by a single application of the screen-printing method and uniform coating on a substrate is also difficult to achieve. These problems could be solved by applying multiple coatings but the precision of printing decreases as the number of coating cycles increases and this also causes the problem of increasing the complexity of the relevant process steps. For these reasons, a need has arisen for the development of a light-sensitive film suitable for use in the formation of solder masks.

Photoresists, also called light-sensitive elements, are used in the formation of conductor patterns in printed circuits. However, they are not suitable for use in the formation of solder masks or protective films for chemical plating since their ability to resist heat, chemicals, etc. is not high enough to warrant use in these applications.

In order to solve these problems, light-sensitive elements adapted for use in the formation of solder masks have been proposed and they include, for example, the method described in U.S. Pat. No. 4,278,752 which relates to a light-sensitive element that is rendered flame-retardant, and the methods described in Japanese Patent Publication Nos. 59-23723 and 60-1885 which both relate to a composition having improved resistance to thermal shocks.

The light-sensitive elements described in these patents successfully attain the intended objects, i.e., heat resistance or resistance to thermal shocks, but they will experience the following problems if used as resists for chemical plating.

The conventional subtractive method of forming circuit patterns is being replaced by the additive method which is capable of forming wired copper patterns in selective areas without relying upon electrolysis. This additive method offers many advantages including the absence of any need for etching copper foils and treatment of the effluent, cost reduction, and increased reliability of through-holes, in particular small ($\leq 0.4$ mm) ones. Because of these advantages, the active method is gaining popularity these days. However, the chemical plating bath employed in this method is strongly alkaline (pH ranging from 12 to 13 at 20° C.) and involves treatment at elevated temperature of 60°–80° C. The light-sensitive elements proposed in the patents noted above are unsuitable for use under such hostile conditions.

Japanese Patent Public Disclosure No. 60-240715 describes a composition which was the ability to resist electroplating. However, with this composition, patterns are formed using an alkali developer, so it essentially has no resistance to strongly alkaline chemical plating baths.

In order to exploit the many advantages of the additive method described above, various versions of this method are under review and they include: the "full additive" method which consists of making through-holes in a substrate or catalyst-loaded substrate, performing an activation treatment on the entire surface of the substrate, printing a plate protective film on the substrate, and imparting the necessary conductor patterns solely by use of an electroless copper plating method; the "semi-additive" method which consists of printing a plate protective film by applying an electroless copper plate over the entire surface of a substrate, forming the necessary conductor patterns by electroplating, and removing the electroless copper plate from all areas of the protective film except those where the conductor patterns have been formed; and the "partly additive" method which employs a copper clad laminate and in which areas where through-holes are to be made are formed by an electroless copper plating method.

A composition that has high resistance to heat and chemicals and which hence is suitable for use as a protective film in these versions of the active method has already been proposed as shown in Japanese Patent Publication No. 61-47182. However, this composition lacks light sensitivity and finds only limited use since it is not amendable to photomechanical processes and is incapable of meeting the need for producing fine circuit patterns.

The present invention has been accomplished in order to solve all of the problems described above. An object, therefore, of the present invention is to provide a light-sensitive resin composition and a light-sensitive element that have high resistance to both heat and chemicals and which are particularly suitable for use in the formation of protective coatings for chemical plating. Another object of the present invention is to provide a light-sensitive resin composition and a light-sensitive resin composition and a light-sensitive element that have the added feature of improved resistance to the heat of soldering and/or improved adhesion to substrates.

DISCLOSURE OF INVENTION

In one aspect, the present invention relates to a light-sensitive resin composition which contains:

(a) a polyurethane (meth)acrylate having at least two (meth)acryloyl groups and at least two urethane bonds in one molecule and which is obtained by recting a (meth)acrylate monoester of a dihydric alcohol with a polyvalent aromatic isocyanate represented by the general formula:

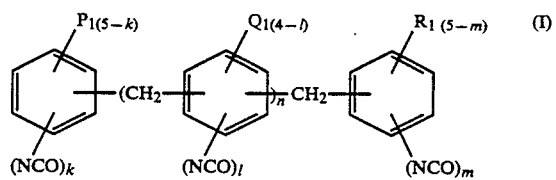

(I)

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(b) a linear high-molecular weight compound; and
(c) a polymerization initiator which generates free radicals upon exposure to light.

This composition which uses as an essential component the urethane (meth)acrylate of the polyvalent aromatic isocyanate represented by the general formula (I) exhibits high resistance to heat and chemicals.

In another aspect, the present invention relates to a light-sensitive resin composition which contains:

(a) 10–60 parts by weight of a polyurethane poly (meth-)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

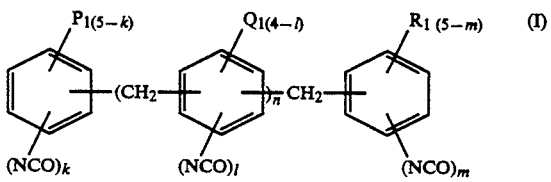

(I)

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(aa) 5–45 parts by weight of a bisphenol type epoxy (meth)acrylate;
(b) 20–60 parts by weight of a linear high-molecular weight compound; and
(c) a polymerization initiator which generates free radicals upon exposure to light, provided that the sum of (a)+(aa) and (b) is 100 parts by weight.

This composition which additionally contains (aa) a bisphenol type epoxy (meth)acrylate is not only resistant to heat and chemicals but also features the advantage of improved resistance to the heat of soldering.

In still another aspect, the present invention relates to a light-sensitive resin composition which contains:

(a) a polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

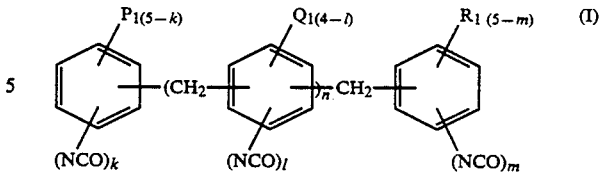

(I)

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(b) a linear high-molecular weight compound;
(c) a polymerization initiator which generates free radicals upon exposure to light; and
(d1) at least one of tetrazole and derivatives thereof; or
(d2) a heterocyclic nitrogenous compound represented by the general formula:

(II)

(where T is an ortho-aromatic hydrocarbon group; X is $CH_2$, NCl, NH, S, O or Se; Z is N or C-Y; Y is H, $NH_2$, an alkyl group having 1–4 carbon atoms, or a halogen).

This composition which contains (d1) one of tetrazole and derivatives thereof or (d2) a heterocyclic nitrogenous compound is not only resistant to heat and chemicals but also features the advantage of improved adhesion to substrates.

BEST MODE FOR CARRYING OUT THE INVENTION

The light-sensitive resin composition of the present invention contains as an essential component (a) a polyurethane poly (meth)acrylate having at least two (meth-)acryloyl groups and at leat two urethane bonds in one molecule and which is obtained by reacting a (meth)acrylate monoester of a dihydric alcohol with a polyvalent aromatic isocyanate represented by the general formula:

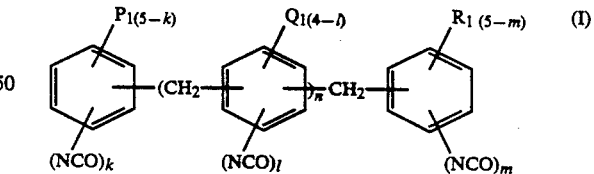

(I)

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20). In general formula (I), $P_{1(5-k)}$ is a hydrogen atom or a methyl group, $Q_{1(4-l)}$ is a hydrogen atom or a methyl group, and $R_{1(5-m)}$ is a hydrogen atom or a methyl group. When k=2, $P_1$, $P_2$ and $P_3$ may be the same or different. An ethyl group and other alkyl groups having more than 2 carbon atoms are not readily availble and hence are not generally recommended. Polyvalent aromatic isocyanates represented by general formula (I) where each of k, l and m is 3 or more are not preferred since they are difficult to obtain on an industrial scale.

In general formula (I), n is an integer of 0–20. If n exeeds 20, the resulting polyurethane poly(meth)acrylate has an extremely high viscosity and is not suitable for use in the present invention.

Examples of the (meth)acrylate monoester of a dihydric alcohol that are preferably used include 2-hydroxyethyl (meth)acrylate and 2-hydroxypropyl (meth)acrylate.

These compounds are preferably reacted in such a way that the NCO equivalent of the isocyanate represented by general formula (I) is approximately equal to the hydroxyl equivalent of the (meth)acrylate monoester of a dihydric alcohol, but the NCO equivalent may be slightly lower than the hydroxyl equivalent.

The term "(meth)acryl" as used herein means acryl and/or methacryl.

The light-sensitive resin composition of the present invention contains as an essential component the urethane (meth)acrylate of the polyvalent aromatic isocyanate represented by general formula (I), so it shows high resistance to wet heat, whereas the already proposed method of using urethane acrylate as a light-sensitive resin composition (e.g., the method described in Japanese Patent Publication No. 59-23723) does not show satisfactory resistance to chemical plating solutions. A study on the wet heat resistance of polyurethane is described in "KOBUNSHI RONBUNSHU", vol. 35, No. 3, 161, 1978 and it has been established that polyurethane from an aromatic isocyanate shows the highest resistance to wet heat. In addition to the use of an aromatic isocyanate, the present invention selectively uses a polyfunctional component as an aromatic isocyanate, so a high crosslink density can be achieved and this contributes to a further improvement in wet heat resistance.

The linear high-molecular weight compound contained as component (b) in the light-sensitive resin composition of the present invention may be selected from any of such compounds including high-molecular weight compounds produced by vinyl copolymerization and those obtained by polycondensation copolymerization. However, from the viewpoints of certain aspects including miscibility with the above-described novolak type urethane (meth)acrylate compound and the adhesion attainable between a circuit board and the layer of resin composition, linear high-molecular weight compounds produced by vinyl copolymerization are preferred. These linear high-molecular weight compounds preferably have a molecular weight in the range of 10,000–500,000.

Those which have a molecular weight of less than 1,000 have reduced resistance to thermal shocks whereas those having a molecular weight of more than 500,000 have reduced miscibility.

Illustrative vinyl monomers that constitute the above-described linear high-molecular weight compounds produced by vinyl copolymerization include, but are not limited to, the following: methyl methacrylate, butyl methacrylate, ethyl acrylate, isobutyl methacrylate, 2-hydroxyethyl methacrylate, 2-hydroxypropyl methacrylate, 2-hydroxyethylacrylate, acrylic acid, methacrylic acid, glycidyl methacrylate, 2,3-dibromopropyl methacrylate, acrylamide, acrylonitrile, tribromophenyl methacrylate, tribromophenyl acrylate, vinyl toluene, styrene, α-methylstyrene, maleimide, N-phenyl maleimide and N-isopropyl maleimide.

Examples of the polymerization initiator which generates free radicals upon exposure to light and which is contained as component (c) in the light-sensitive resin composition of the present invention include: quinones such as 2-ethyl anthraquinone, 2-t-butyl anthraquinone, octamethyl anthraquinone, 1,2-benzanthraquinone and 2,3-diphnyl anthraquinone; α-ketaldonyl alcohols and ethers such as benzoin, pivaloin and acyloinether; ketones such as α-phenylbenzoin, α,α'-diethoxyacetophenone, benzophenone and 4,4'-bisdialkylaminobenzophenone; and 2,4,5-triaryl imidazole dimers. These monomers may be used either on their own or as admixtures.

The bisphenol type epoxy (meth)acrylate which is contained as component (aa) in the light-sensitive resin composition according to another aspect of the present invention is obtained by reacting a bisphenol type epoxy resin with (meth)acrylic acid. If it is necessary for the resistance of the resin composition of the present invention to the heat of soldering to be improved to such an extent that it becomes flame-retardant, a bromated bisphenol type epoxy resin, preferably one having a bromine content of 10–60% (all percents used herein are on a weight basis), may be used. Examples of such bisphenol type epoxy resin include, but are not limited to, the following: Epikote 801, 802, 807, 808, 815, 819, 825, 827, 828, 834, 1001, 1002, 1003, 5050 and 5051 (all being produced by Yuka-Shell Co., Ltd.), DER 332, 662, 542 and 511 (all being produced by Dow Checmial Company), EPOMIC R-130, R-139, R-140, R-144, R-210 and R-211 (all being produced by Mitsui Petrochemical Industries, Ltd.) and Araldite CY-225, CY-205, CY-207, CY-221 and CY-206 (all being produced by Ciba-Geigy).

Use of at least one of tetrazole and derivatives thereof, which is contained as component (d1) in the light-sensitive resin composition according to still another aspect of the present invention, is very effective in improving the adhesion of a photoresist to a metal substrate on which a layer of said light-sensitive resin composition is formed. It is particularly notable here that even if a strong alkaline plating solution is used, good adhesion to the metal substrate is ensure, thereby preventing the occurrence of such problems as lifting of the layer of said light-sensitive resin composition and discoloration of the metal substrate. Examples of compound that may be use as component (d1) include 1-phenyl tetrazole, 5-phenyl tetrazole, 5-amino tetrazole, 5-amino-1-methyl tetrazole, 5-amino-2-phenyl tetrazole, 5-mercapto-1-phenyl tetrazole, and 5-mercapto-1-methyl tetrazole. The amount in which these compounds are added to the composition is not generally determined since it varies with the components of an intended photoresist, their proportions and the hardness of the photoresist after it is photocured. In order to attain effective adhesion, however, these compounds are added in an amount of 0.001–2 wt %, preferably 0.01–1.0 wt %, of the composition. Excessive addition will lead to a lower sensitivity.

The heterocyclic nitrogenous component contained as component (d2) in the light-sensitive resin composition according to still another aspect of the present invention also proves to be effective in improving the adhesion of a photoresist to a metal substrate on which a layer of said light-sensitive composition is formed. It is particularly notable here that even if a strong alkaline plating solution is used, good adhesion to the metal substrate is ensured, thereby preventing the occurrence of such problems as lifting of the layer of said light-sensitive resin composition and discoloration of the metal substrate. Examples of compounds that may be used as component (d2) include benzimidazole 2-aminobenzimidazole, 2-methylbenzimidazole, 5-nitrobenzimidazole, 5-methylbenzimidazole, benzotriazole, 1-chlorobenzotriazole and 2-aminobenzothiazole. The amount in which these compounds are added to the composition is not generally determined since it varies with the components of an intended photoresist, their proportions and the hardness of the photoresist after it is photocured. In order to attain effective adhesion, however these compounds are added in an amount of 0.001-5 wt %, preferably 0.01-1.0 wt %, of the composition. Excessive addition will lead to a lower sensitivity.

In an embodiment of the first aspect of the present invention, the light-sensitive resin composition is prepared by mixing 20-80 parts by weight, preferably 30-60 parts by weight, of component (a), 20-80 parts by weight, preferably 30-60 parts by weight, of component (b), and 1-10 parts by weight, preferably 3-7 parts by weight, of component (c), so that the sum of components (a), (b) and (c) amounts to 100 parts by weight.

If the amount of component (a) is less than 20 parts by weight, resistance to chemical plating solutions is reduced. If the amount of component (a) exceeds 80 parts by weight, resistance to heat shocks is impaired. If the amount of component (b) is outside the range set forth above, resistance to heat shocks and chemical plating solutions is reduced. If the amount of component (c) is less than 1 part by weight, curability with uv radiation is reduced to cause a decrease in sensitivity. If the amount of component (c) exceeds 10 parts by weight, sensitivity is improved but the above-described properties will be impaired.

In the second aspect of the present invention, the light-sensitive resin composition containing component (aa) is prepared by mixing 10-60 parts, preferably 15-55 parts, of component (a), 5-45 parts, preferably 10-40 parts, of component (aa), 20-60 parts, preferably 30-50 parts, of component (b), and 1-10%, preferably 3-7%, of component (c) on the basis of the sum of components (a), (aa) and (b), in such a way that the sum of components (a), (aa) and (b) amounts to 100 parts.

If the amount of component (a) is less than 10 parts, resistance to chemical plating solutions becomes insufficient. If the amount of component (a) exceeds 60 parts, resistance to heat shocks is imparied. If the amount of component (aa) is outside the range set forth above, unfavorable conditions will result in view of such aspects as resistance to heat and chemical plating solutions. If the amount of component (b) is outside the range set forth above, unfavorable conditions will result in view of such aspects as resistance to heat shocks and chemical plating solutions. If the amount of component (c) is less than 1%, curability with uv radiation is reduced to cause a decrease in sensitivity. If the amount of component (c) exceeds 10%, sensitivity is improved but the above-described properties will be impaired.

If desired, the light-sensitive resin composition of the present invention may contain, as appropriate, other auxiliary components including dyes or pigments for coloration, thermal polymerization inhibitors as preservatives or stabilizers, additives for improving adhesion to wired conductors, and chelating agents. The type and amount of these optional additives may be determined as in the case of ordinary light-sensitive resin compositions.

The light-sensitive resin composition of the present invention may be used in the absence of diluents but preferable results are attained by using it in combination with solvents that dissolve the base resin and which do not have very high boiling points, such as methyl ethyl ketone, methylene chloride, methylene chloride/methyl alcohol mixture, and isopropyl alcohol. These solvents are used in amounts of no more than 200 wt %, preferably 100-200 wt %, of the composition.

The light-sensitive resin composition of the present invention is used after being laminated on a metal surface, such as copper, nickel or chromium, preferably copper. Stated more specifically, the composition in the form of a liquid resist is coated on a metal surface, dried and covered with a protective film. Alternatively, the composition may be processed into a dry film photoresist, which is a light-sensitive element according to another aspect of the present invention.

The cover film for use in the case where the composition of the present invention is applied as a liquid resist is preferably made of an inert polyolefin such as polyethylene or polypropylene. A dry film photoresist is prepared by coating the photopolymerizable resin composition on a polyester film support, drying the coating, and laminating it with a polyolefin cover film.

In accordance with another aspect of the present invention, there is provided a light-sensitive element using the above-described light-sensitive resin composition. This element is described hereinafter in detail.

A light-sensitive element according to this aspect of the present invention is obtained by forming a uniform layer of the above-described light-sensitive resin composition on a film support. A layer of the composition can be formed on the support by coating a solution of said composition on the support by such a technique as knife-coating or roller coating, and drying the applied coating.

A solution of the composition is prepared by dissolving said composition uniformly in an organic solvent such as methyl ethyl ketone or toluene (provided, however, that pigments, insoluble flame-retardants and fillers are dispersed uniform). If the applied solution is to be dried to form a film, the amount of residual solvent is preferably reduced to 1% or below and this is necessary to retain the characteristics of the light-sensitive element obtained.

The support used in another aspect of the present invention must have the heat resistance (during drying) and resistance to chemicals necessary for allowing the light-sensitive element to be produced. The support is desirably transparent to exposing light. A preferred example is a polyester film.

When the light-sensitive element is to be produced continuously, it is taken up in roll form in the step at the final stage and in this case, a peelable protective (cover) film is laminated on the layer of the light-sensitive resin composition in said element. Examples of such a peelable cover film include a polyethylene film, a polypropylene film and surface-treated paper. Any material can be used as the cover film if its adhesion to the layer of the light-sensitive resin composition, when it is being pelled, is smaller than the adhesion between the layer of the light-sensitive resin composition and the film support. The light-sensitive element may also be prepared using as a cover film a support the back surface of which has been treated.

The layer of the light-sensitive resin composition as a component of the light-sensitive element according to another aspect of the present invention preferably has a thickness of 10-200 μm in order to maintain a high degree of electrical insulation between conductors on the printed circuit board to which said element is to be applied and from the viewpoint of resolution of the patterns of solder mask to be formed.

The light-sensitive element in accordance with another aspect of the present invention is to be used in the following manner.

The light-sensitive element in accordance with this aspect of the present invention is laminated on a substrate by thermal compression after the cover film is peeled. Lamination by thermal compression can be effected with a well known laminator. With a substrate having prepatterned lines of wired conductor, lamination by thermal compression either at reduced pressure or under vacuum is preferred since it ensures good coverage of the circuit pattern.

After lamination, the light-sensitive element can be exposed and developed by standard methods. Stated more specifically, exposure is performed through a negative mask using a high-pressure or ultrahigh-pressure mercury lamp as a light source. After exposure, the element is heat-treated at 50°-100° C. for 10-30 minutes and after being stripped of the support, the element is developed with a developer. The developer uses a solvent such as 1,1,1-trichloroethane. The use of a non-flammable solvent is preferred from a safety viewpoint.

The imagewise protective coating obtained by the method described above serves as a corrosion-resistant film for use in etching or plating under normal conditions. It will become a protective coating having further improved characteristics as a result of heat treatment at 80°-200° C. and illumination by actinic light both of which are conducted after the development. Preferably, this post-treatment is usually effected by first performing illumination with actinic light, the heat treatment then being carried out for 30-60 minutes.

The protective coating that is obtained by heat treatment and exposure with actinic light following the development has a satisfactory ability to withstand organic solvents such as Tri-Clene, methyl ethyl ketone, isopropyl alcohol and toluene and is also resistant to acidic or alkaline aqueous solutions. Furthermore, this coating has improved resistance to both heat and thermal shocks, so it is advantageous for use as a permanent protective coating such as a solder mask that demands long-term reliability.

The following are several examples of the present invention. They show mere embodiments and should not be taken as limiting the present invention.

EXAMPLES 1-11

Four hundred and fifty parts by weight of Millionate MR-400 [the trade name of Nippon Polyurethane Industry Co., Ltd. for a polyvalent aromatic isocyanate represented by general formula (I)] were reacted with 400 p parts by weight of 2-hydroxyethyl acrylate to obtain polyurethane acrylate (PUA-1).

This polyurethane acrylate (PUA-1), a linear high-molecular weight compound and a photoolymerization initiator were mixed in the proportions shown in Table 1, so as to obtain light-sensitive resin compositions according to examples of the present invention. The numerals in Table 1 denote parts by weight. Resin solutions (40-60% in concentration) were prepared using methyl ethyl ketone as a solvent, and these resin solutions were applied onto a polyethylene terephthalate film and dried with heat to obtain light-sensitive elements according to another aspect of the present invention which had a layer of light-sensitive resin composition in a thickness of about 50 μm.

CHARACTERISTIC EVALUATION TESTS

Through-holes and parts holes were formed in a copper clad glass epoxy laminate having a substrate thickness of 1.6 mm and a copper foil thickness of 18 μm. Subsequently, the laminate was subjected to a catalytic treatment for electroless plating, and a circuit pattern was formed thereafter. The light-sensitive elements were laminated on these substrates with a laminator. After the lamination, the light-sensitive elements were exposed through a negative mask, heated at 80° C. for 10 minutes, and thereafter spray-developed with 1,1,1-trichloroethane (20° C.×80 seconds). After the development, the elements were dried at 80° C. for 5 minutes and illuminated under a high-pressure mercury lamp (80 W/cm) with an energy level of 2.5 J/cm². Thereafter, the elements were heat-treated at 150° C. for 30 minutes to form protective films.

In the next place, the substrates were immersed for 15 hours in an electroless plating bath (pH, 12.5 (20° C.); 60° C.) to fill the through-holes and parts holes with a copper plate to a thickness of about 23 μm. After the electroless plating treatment, the substrates were washed thoroughly with water, dried at 80° C. for 10 minutes and further heat-treated at 130° C. for 60 minutes. During the electroless plating and subsequent treatments, the protective films did not experience any deterioration, swelling or peeling and showed satisfactory resistance.

The substrates were also subjected to a test for evaluating their resistance to the heat of soldering by immersion in a solder bath (255°-265° C.) for 10 seconds. The protective films remained stable and no detectable cracking or peeling occurred. This shows that the light-sensitive elements tested will serve satisfactorily as solder masks in practical applications.

TABLE 1

| Composition | | 1 | 2 | 3 | 4 | 5 | 6 | 7 | 8 | 9 | 10 | 11 |
|---|---|---|---|---|---|---|---|---|---|---|---|---|
| PUA-1 | | 55 | 65 | 60 | 55 | 50 | 45 | 40 | 55 | 57 | 54 | 30 |
| PMMA | (1) | 40 | — | — | — | — | — | — | — | — | — | — |
| PMA | (2) | — | 30 | 35 | 40 | 45 | 50 | 55 | — | 20 | 20 | — |
| PMBMA | (3) | — | — | — | — | — | — | — | 40 | 20 | 20 | 65 |
| 2EAQ | (4) | 5 | — | — | — | — | — | — | 5 | 3 | 6 | 5 |
| MK | (5) | — | 0.5 | 0.5 | 0.5 | 0.5 | 0.5 | 0.5 | — | — | — | — |
| BP | (6) | — | 4.5 | 4.5 | 4.5 | 4.5 | 4.5 | 4.5 | — | — | — | — |

(1) methyl methacrylate polymer (Mw ≈ 80,000—)
(2) methyl methacrylate/methyl acrylate (80/20) polymer (Mw ≈ 100,000—)
(3) methyl methacrylate/butyl methacrylate/methacrylic acid (80/18/2) polymer (Mw ≈ 120,000—)
(4) 2-ethyl anthraquinone
(5) Michler's ketone
(6) benzophenone

COMPARATIVE EXAMPLE 1

A urethane acrylate was synthesized as in the Examples using 336 g (four equvalents) of hexamethylene diisocyanate and 533 g (4.1 moles) of hydroxyethyl methacrylate.

A solution of light-sensitive resin composition was prepared from the recipe shown below by repeating the procedures employed in the Examples, and a light-sensitive element was produced. The mixing proportions were as follows:

| | |
|---|---|
| Urethane acrylate | 55 parts by weight |

| | |
|---|---|
| PMMA | 40 parts by weight |
| 2EAQ | 5 parts by weight |

After an electroless plating treatment, part of the surface of the protective film formed of the light-sensitive element turned opaque and part of that opaque area separated from the substrate. In a test conducted for evaluating the resistance of the protective film to the heat of soldering swelling was observed in the area where peeling occurred but the other areas remained unchanged. As these results show, the light-sensitive element of Comparative Example 1 was usable as a solder mask but unlike the light-sensitive element according to another aspect of the present invention, it was difficult to use this comparative sample as a protective film in chemical plating.

EXAMPLE 12

(1) Synthesis of polyurethane acrylate compound

A 2-L flask was charged with 504 g (4 equvalents) of a compound having the following structural formula:

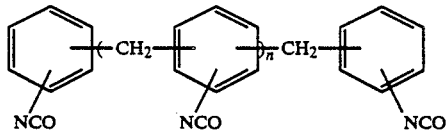

(n is 0.6 on average; isocyanate equivalent, 126), 533 g (4.1 moles) of hydroxyethyl methacrylate and 692 g of methyl ethyl ketone, and reaction was performed at 60° C. for 8 hours after addition of 2.1 g (0.2 wt % on a solids basis) of zinc octylate. During the reaction, air was blown at a rate of 1 ml/min in order to prevent polymerization. Thereafter, measurements of NCO equivalent were performed by a standard method and the reaction was terminated when the NCO value became 0.2 or below.

(2) Synthesis of bisphenol type epoxy acrylate

A 1-L flask was charged with 570 g (3 equivalents) of Epikote (product of YUKA-Shell Co., Ltd., epoxy equvalent, 190) and 201 g (2.8 moles) of acrylic acid. Following the addition of 0.77 g (0.1 wt %) of methoxyphenol as a polymerization inhibitor and 3.9 g (0.5 wt %) of benzyldimethylamine, reaction was performed at 90° C. for 6 hours. Thereafter, acid value measurements were conducted by a standard method and the reaction was terminated when the acid value became 1 or below.

(3) Preparation of light-sensitive element

| | |
|---|---|
| Urethane acrylate synthesized in (1) | 40 parts (60% (24 parts) on a solids basis) |
| Epoxy acrylate synthesized in (2) | 25 parts |
| Methyl methacrylate/butyl methacrylate/methacrylic acid (weight ratio: 80/18/2: mol. wt., ca, 1.5 × 10⁵) | 40 parts |
| 2-Ethyl anthraquinone | 4.5 parts |
| p-Methoxyphenol | 0.1 parts |
| Methyl ethyl ketone | 45 parts |

Using the recipe shown above, a solution of a light-sensitive resin composition was prepared in accordance with an example of another aspect of the present invention. This resin solution was applied onto a polyethylene terephthalate film 25 μm thick, dried first at room temperature for 20 minutes, then at 70° C. for 10 minutes and final at 100° C. for 5 minutes, so as to obtain a light-sensitive element according to an example of still another aspect of the present invention, in which the layer of light-sensitive resin composition had a thicknes of about 70 μm.

CHARACTERISTIC EVALUATION TEST

Through-holes and parts holes were formed in a copper clad epoxy laminate having a substrate thickness of 1.6 mm and a copper foil thickness of 18 μm. Subsequently, the laminate was subjected to a catalytic treatment for electroless plating, and a circuit pattern was formed thereafter. The light-sensitive element prepared in (3) was laminated on this substrate with a laminator. After the lamination, the light-sensitive element was exposed through a negative mask, heated at 80° C. for 10 minutes, and thereafter spray-developed with 1,1,1-trichloroethane (20° C.×80 seconds). After the development, the element was dried at 80° C. for 5 minutes and illuminated under a high-pressure mercury lamp (80 W/cm) with an energy level of 2.5 J/cm². Thereafter, the element was heat-treated at 150° C. for 30 minutes to form a protective film.

In the next place, the substrate was immersed for 16 hours in an electroless plating bath (pH, 12.5 (20° C.); 60° C.) to fill the through-holes and parts holes with a copper plate to a thickness of about 25 μn. After the electroless plating treatment, the substrate was washed thoroughly with water, dried at 80° C. for 10 minutes and further heat-treated at 130° C. for 60 minutes. During the electroless plating and subsequent treatments, the protective film did not experience any deterioration, swelling or pelling and showed satisfactory resistance.

The substrate was also subjected to a test for evaluating its resistance to the heat of soldering by immersion in a solder bath (255°–265° C.) for 10 seconds. The protective film remained stable and no detectable cracking or peeling occurred. This shows that the light-sensitive element tested will serve satisfactorily as a solder masks in practical applications.

EXAMPLE 13

(1) Synthesis of bisphenol type epoxy acrylate

A 1-L flask was charged with 173 g (1 equvalent) of DER 332 (product of Dow checmical Company; epoxy equvalent, 173), 660 g (2 equvalents) of DER 542 (product of Dow Chemical Company; Br content, 46%; epoxy equvalent, 380) and 201 g (2.8 moles) of acrylic acid, and following the addition of 1.0 g (0.1 wt %) of methoxyphenol and 5.1 g (0.5 wt %) of benzyldimethylamine, reaction was performed at 90° C. for 6 hours. By performing subsequent operations as in Example 12, epoxy acrylate was synthesized.

(2) Preparation of light-sensitive element

| | |
|---|---|
| Polyurethane acrylate synthesized in Example 12 | 40 parts (60% (24 parts) on a solids basis) |
| Epoxy acrylate synthesized in (1) | 30 parts |
| Methacrylic acid copolymer used in Example 12 | 35 parts |
| 2-Ethyl anthraquinone | 4.5 parts |
| p-Methoxyphenol | 0.1 parts |
| Methyl ethyl ketone | 46 parts |

| | |
|---|---|
| Victorian Blue | 0.02 parts |

Using the recipe shown above, a solution of a light-sensitive resin composition was prepared in accordance with another example of another aspect of the present invention. With this solution, a light-sensitive element was produced in accordance with another example of still another aspect of the present invention.

Using the light-sensitive element thus obtained, a protective film was formed on a substrate as in Example 12.

In the next place, the substrate with the protective film was immersed for 16 hours in an electroless copper plating bath (pH, 12.5 (20° C.); 60° C.) to fill the through-holes and parts holes with a copper plate in a thickness of about 25 μm. After the electroless plating treatment, the substrate was washed thoroughly with water, dried at 80° C. for 10 minutes and further heat-treated at 150° C. for 60 minutes. During the electroless plating and subsequent treatments, the protective film did not experience any deterioration, swelling or peeling and showed a satisfactory protective capability.

As in Example 12, a test was conducted for evaluating the resistance of the coated substrate to the heat of soldering. The protective film remained stable and proved to be usable satisfactorily as a solder mask in practical applications.

By repeating the procedures described above, a protective film was also formed on a substrate having a flame retardancy grade of 94 V-O under UL. A flame-retardancy test conducted on this protective film showed that it complied with the specifications of UL 94 V-O.

EXAMPLE 14

(1) Synthesis of polyurethane acrylate

A 2-L flask was charged with 564 g (4 equivalents) of a compound having the following structural formula:

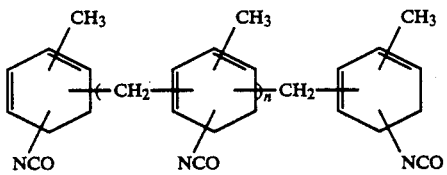

(n is 0.8 on average; isocyanate equivalent, 141), 475 g (4.1 moles) of hydroxyethyl acrylate and 692 g of methyl ethyl ketone, and following the addition of 2 g (0.2 wt % on a solids basis) of zinc octylate, reaction was performed as in Example 12.

(2) Synthesis of bisphenol type epoxy acrylate

A 2-L flask was charged with 380 g (2 equvalents) of Epikote 828, 475 g (1 equvalent) of Epikote 1001 (epoxy equvalent, 475), 201 g (2.8 moles) of acrylic acid and 352 g of toluene. Following the addition of 1 g (0.1 wt % on a solids basis) of methoxyphenol as a polymerization inhibitor and 5.2 g (0.5 wt % on a solids basis) of benzylmethylamine, reaction was performed as in Example 12.

(3) Preparation of light-sensitive element

| | |
|---|---|
| Polyurethane acrylate synthesized in (1) | 40 parts (60% (24 parts) on a solids basis) |
| Epoxy acrylate synthesized in (2) | 27 parts (75% (20 parts) on a solids basis) |
| Methacrylic acid copolymer used in Example 12 | 30 parts |
| Benzophenone | 3 parts |
| Michler's ketone | 0.6 parts |
| p-Methoxyphenol | 0.05 parts |
| Methylene Blue | 0.01 part |
| Methyl ethyl ketone | 28 parts |

Using the recipe shown above, a solution of a light-sensitive resin composition was prepared in accordance with another example of another aspect of the present invention, and a light-sensitive element was produced in accordance with another example of still another aspect of the present invention. The schedule of drying the layer of the light-sensitive resin composition was as follows: heating at room temperature for 20 minutes, 80° C. for 10 minutes, and 110° C. for 5 minutes.

Using the light-sensitive element thus obtained, a protective film was formed on a substrate as in Example 12, and thereafter subjected to an electroless plating treatment as in Example 12. During the electroless plating and subsequent treatments, the protective film did not experience any deterioration, swelling or peeling and showed a satisfactory protective capability. When a test was conducted as in Example 12 to evaluate resistance to the heat of soldering, the protective film proved to be satisfactorily resistant in practical applications.

EXAMPLES 15–29

Using the urethane acrylates and epoxy acrylates synthesized in Examples 12–14, solutions of light-sensitive resin compositions were prepared as in Example 12 in accordance with other examples of another aspect of the present invention, and light-sensitive elements were produced in accordance with other examples of still another aspect of the present invention. The recipes adopted in these examples are shown in Table 2.

The abbreviations used in Table 2 have the following meanings:
UA-1: Urethane acrylate synthesized in Example 12
UA-2: Urethane acrylate synthesized in Example 14
EA-1: Epoxy acrylate synthesized in Example 12
EA-2: Epoxy acrylate synthesized in Example 13
EA-3: Epoxy acrylate synthesized in Example 14
BP-1: Methacrylic acid copolymer used in Example 12
BP-2: Methy methacrylate/butyl methacrylate/N-phenyl maleimide (weight ratio, 80/15/5) copolymer; mol. wt. ca $1.2 \times 10^5$
BP-3: Methyl methacrylate/butyl methacrylate/tribromophenyl acrylate (weight ratio, 50/20/30) copolymer; mol. wt. ca. $1.5 \times 10^5$ Using the light-sensitive elements obtained, protective films were formed as in Example 12, and thereafter subjected to an electroless plating treatment and a test for evaluation of resistance to the heat of soldering.

The results are shown in Table 2, from which one can see that the light-sensitive elements in accordance with examples of another aspect of the present invention showed a satisfactory protecting capability both in electroless plating and as a solder mask.

COMPARATIVE EXAMPLE 2

(1) Synthesis of polyurethane acrylate

Using 336 g (4 equivalents) of hexamethylene diisocyanate, 533 g (4.1 moles) of hydroxyethyl methacrylate, 579 g of methyl ethyl ketone and 1.7 g (0.2 wt % on a solids basis) of zinc octylate, urethane acrylate was synthesized as in Example 12.

(2) Preparation of light-sensitive element

Using the recipe shown below, a solution of a light-sensitive resin composition was prepared as in Example 12, and a light-sensitive element was fabricated from this solution.

| | |
|---|---|
| Urethane acrylate synthesized in (1) | 40 parts (60% (24 parts) on a solids basis) |
| Epoxy acrylate synthesized in Example 12 | 25 parts |
| Linear polymer used in Example 12 | 40 parts |
| 2-Ethyl anthraquinone | 4.5 parts |
| p-Methoxyphenol | 0.1 part |
| Methyl ethyl ketone | 45 parts |

CHARACTERISTIC EVALUATION TESTS

Using the light-sensitive element obtained, a protective film was formed on a substrate as in Example 12 and thereafter subjected to an electroless plating treatment and a test for evaluating resistance to the heat of soldering. After the electroless plating treatment, part of the surface of the protective film turned iopaque and part of that opaque area separated from the substrate. In the test conducted for evaluating resistance to the heat of soldering, swelling was observed in the area where peeling occurred but the other areas remained unchanged. As these results show, the light-sensitive element of Comparative Example 2 was usable as a solder maks but unlike the light-sensitive element according to another aspect of the present invention, it was difficult to use this comparative sample as a protective film in chemical plating.

COMPARATIVE EXAMPLES 3 AND 4

Samples were prepared with the proportion of the novolak type urethane acrylate being varied as shown in Table 2, and these samples were treated as in Example 12, followed by an electroless plating treatment and a test for evaluating resistance to the heat of soldering. The results are shown in Table 2.

As these results show, the intended characteristics are not obtained if the addition of the novolak type urethane acrylate is outside the range specified in the present invention.

EXAMPLES 30–39

Polyurethane acrylate (PUA-1) was obtained as in Example 1 and this polyurethane acrylate (PUA-1) was mixed with a linear polymer, photopolymerization initiator and tetrazole or derivatives thereof in the proportions shown in Table 3 so as to make light-sensitive resin compositions in accordance with examples of another aspect of the present invention. The numerals in Table 3 denote parts by weight. Using methyl ethyl ketone as a solvent, resin solutions (40–60% in concentration) were prepared. They were applied onto a polyurethane terephthalate film and dried with heat to obtain light-sensitive elements according to another aspect of the present invention which had a layer of light-sensitive resin composition in a thickness of about 50 μm.

TABLE 2

| | Composition (parts) | | | | | | | | Results of evaluation | | |
|---|---|---|---|---|---|---|---|---|---|---|---|
| | novolak type urethane acrylate | | bisphenol type epoxy acrylate | | linear high-molecular weight compound | | photo-polymerization initiator | methyl ethyl ketone | p-methoxy phenol | immersion in electroless Cu plating bath | | test for resistance to the heat of soldering |
| | | | | | | | | | | surface of protective film | peeling | |
| Example No. | | | | | | | | | | | | |
| 15 | UA-1(1) | 50 | EA-3(2) | 26 | BP-2 | 40 | 2-ethyl anthra quinone | 3.6 | 35 | 0.09 | O.K. | absent | O.K. |
| 16 | " | " | " | 40 | " | " | 2-ethyl anthra quinone | 4.0 | 39 | 0.1 | " | " | " |
| 17 | " | " | " | " | 53 | " | " | 2-ethyl anthra quinone | 4.4 | 43 | 0.11 | " | " | " |
| 18 | UA-2(1) | 34 | EA-1 | 30 | BP-3 | " | 2-ethyl anthra quinone | 3.6 | 46 | 0.1 | " | " | " |
| 19 | " | 50 | " | " | " | " | 2-ethyl anthra quinone | 4.0 | 49 | " | " | " | " |
| 20 | " | 66 | " | " | " | " | 2-ethyl anthra quinone | 4.4 | 52 | " | " | " | " |
| 21 | UA-1(1) | 40 | EA-1 | 25 | BP-1 | 30 | 2-ethyl anthra quinone | 3.1 | 39 | 0.08 | " | " | " |
| 22 | " | " | " | " | " | 50 | 2-ethyl anthra quinone | 4.0 | 52 | 0.1 | " | " | " |
| 23 | " | 100 | " | " | " | " | 2-ethyl anthra quinone | 6.4 | 40 | 0.11 | " | " | " |

TABLE 2-continued

| | Composition (parts) | | | | | | Results of evaluation immersion in electroless Cu plating bath | | test for |
|---|---|---|---|---|---|---|---|---|---|
| | novolak type urethane acrylate | bisphenol type epoxy acrylate | linear high-molecular weight compound | photo-polymer-ization initiator | methyl ethyl ketone | p-meth-oxy phenol | surface of pro-tective film | peeling | resistance to the heat of soldering |
| 24 | " | 85 | " | 5 | " | 45 | 2-ethyl anthra quinone | 4.0 | " | 0.1 | " | " | " |
| 25 | " | 75 | " | 10 | " | " | 2-ethyl anthra quinone | " | 45 | " | " | " | " |
| 26 | " | 67 | " | 15 | " | " | 2-ethyl anthra quinone | " | 50 | " | " | " | " |
| 27 | " | 58 | " | 20 | " | " | 2-ethyl anthra quinone | " | 55 | " | " | " | " |
| 28 | " | 100 | " | 5 | " | 35 | 2-ethyl anthra quinone | " | 40 | " | " | " | " |
| 29 | " | 92 | " | " | " | 40 | 2-ethyl anthra quinone | " | 42 | " | " | " | " |
| Comp. Exp. | | | | | | | | | | | | | |
| 3 | " | 8 | " | " | " | " | 2-ethyl anthra quinone | 3.8 | " | 0.08 | partly turned opaque | " | " |
| 4 | " | 110 | " | " | " | 30 | 2-ethyl anthra quinone | 4.0 | 40 | 0.1 | O.K. | " | partly peeled |

TABLE 3

| Composition | Example No. | | | | | | | | | | Comparative Example 6 |
|---|---|---|---|---|---|---|---|---|---|---|---|
| | 30 | 31 | 32 | 33 | 34 | 35 | 36 | 37 | 38 | 39 | |
| PUA-1 | 65 | 60 | 55 | 50 | 45 | 40 | 50 | 50 | 50 | 50 | 50 |
| PMA (1) | 30 | 35 | 40 | 45 | 50 | 55 | 45 | 45 | 45 | 45 | 45 |
| Photopolymerization initiator (2) | 5.0 | 5.0 | 5.0 | 5.0 | 5.0 | 5.0 | 5.0 | 5.0 | 5.0 | 6.0 | 5.0 |
| 5PT (3) | 0.2 | 0.2 | 0.2 | — | 0.2 | 0.2 | — | — | — | — | 0 |
| 5AT (4) | — | — | — | 0.2 | — | — | 0.1 | 0.5 | 1.0 | 0.2 | 0 |
| GX-6099 (5) | — | — | — | — | — | — | — | — | — | 12 | — |
| $Sb_2O_3$ | — | — | — | — | — | — | — | — | — | 6 | — |

(1) methyl methacrylate/methyl acrylate (80/20) copolymer (Mw = 120,000)
(2) Michler's ketone/benzophenone (1/10 in weight ratio) mixture
(3) 5-phenyltetrazole
(4) 5-aminotetrazole
(5) tribromophenyl methacrylate (trade name of Dai-ichi Kogyo Seiyaku Co., Ltd.)

CHARACTERISTIC EVALUATION TESTS

Through-holes and parts holes were formed in a copper clad glass epoxy laminate having a substrate thickness of 1.6 mm and a copper foil thickness of 18 μm. Subsequently, the laminate was subjected to a catalytic treatment for electroless plating, and a circuit pattern was formed thereafter. The light-sensitive dry films previously obtained were laminated on these substrates with a laminator. After the lamination, the light-sensitive elements were exposed through a negative mask, heated at 80° C. for 10 minutes, and thereafter spray-developed with 1,1,1-trichloroethane (20° C.×80 seconds). After the development, the elements were dried at 80° C. for 5 minutes and illuminated under a high-pressure mercury lamp (80 W/cm) with an energy level of 2.5 J/cm². Thereafter, the elements were heat-treated at 150° C. for 30 minutes to form protective films.

In the next place, the substrates were immersed for, 15, 20 or 25 hours in an electroless plating bath (pH, 12.5 (20° C.); 60° C.) to fill the through-holes with a copper plate to a thickness of ca. 23, 30 or 38 μm. After the electroless plating treatment, the substrates were washed thoroughly with water, dried at 80° C. for 10 minutes and further heat-treated at 130° C. for 60 minutes. During the electroless plating and subsequent treatments, the protective films did not experience any deterioration, swelling or peeling and showed satisfactory resistance.

The substrates were also subjected to a test for evaluating their resistance to the heat of soldering by immersion in a solder bath (255°-265° C.) for 10 seconds. The protective films remained stable and no detectable cracking or peeling occurred. This shows that the light-sensitive elements tested will serve satisfactorily as solder masks in practical applications.

The results of Examples 30–39 are shown in Table 4.

COMPARATIVE EXAMPLE 5

Using 336 g (4 equivalents) of hexamethylene diisocyanate and 533 g (4.1 moles) of hydroxyethyl methacrylate, urethane acrylate was synthesized as in Example 1.

Using the recipe shown below, a solution of a light-sensitive resin composition was prepared as in the Examples and a light-sensitive dry film was produced from this solution.

However, after 25-h plating, the sample under test experienced resist peeling in the areas where encroachment of the plating solution had occurred.

TABLE 4

|  | Exposure necessary for patterning (mj/cm²) | Electroless Cu plating (pH 12.5, 60° C.) | | | Resistance to the heat of soldering | |
|---|---|---|---|---|---|---|
|  |  | 15 h | 20 h | 25 h | 15 h plating | 25 h plating |
| Ex. |  |  |  |  |  |  |
| 30 | 180 | O.K. | O.K. | O.K. | O.K. | O.K. |
| 31 | 180 | O.K. | O.K. | O.K. | O.K. | O.K. |
| 32 | 150 | O.K. | O.K. | O.K. | O.K. | O.K. |
| 33 | 150 | O.K. | O.K. | O.K. | O.K. | O.K. |
| 34 | 130 | O.K. | O.K. | O.K. | O.K. | O.K. |
| 35 | 130 | O.K. | O.K. | O.K. | O.K. | O.K. |
| 36 | 150 | O.K. | O.K. | O.K. | O.K. | O.K. |
| 37 | 150 | O.K. | O.K. | O.K. | O.K. | O.K. |
| 38 | 150 | O.K. | O.K. | O.K. | O.K. | O.K. |
| 39 | 150 | O.K. | O.K. | O.K. | O.K. | O.K. |
| Comparative Ex. |  |  |  |  |  |  |
| 5 | 130 | encroachment of plating solution | turned opaque | turned opaque | O.K. | peeling |
| 6 | 150 | O.K. | encroachment of plating solution | encroachment of plating soltuion | O.K. | peeling |

The mixing proportions of the ingredients were as follows:

| Urethane acrylate | 55 parts by weight |
|---|---|
| PMBMA | 40 parts by weight |
| M. K. (Michler's ketone) | 0.5 parts by weight |
| B. P. (benzophenone) | 4.5 parts by weight |

COMPARATIVE EXAMPLE 6

Using the recipe shown in Table 3, a light-sensitive resin composition was prepared as in the Examples and a light-sensitive element was produced from this resin composition.

CHARACTERISTIC EVALUATION TESTS

Using the light-sensitive elements thus obtained, protective films were formed on a substrate as in the Examples and thereafter subjected to an electroless plating treatment and a test for evaluating resistance to the heat of soldering. After the electroless plating treatment, part of the surface of the protective film using the light-sensitive element prepared in Comparative Example 5 turned opaque and part of that opaque area separated from the substrate. In the test conducted for evaluating resistance to the heat of soldering, swelling was observed in the area where peeling occurred but the other areas remained unchanged. As these results show, the light-sensitive resin composition prepared in Comparative Example 5 was usable as a solder mask but unlike the light-sensitive resin composition of the present invention, it was difficult to use this comparative sample as a protective film in chemical plating.

The sample using the light-sensitive element of Comparative Example 6 performed satisfactorily in 15-h electroless copper plating. However, after 20-h electroless copper plating, the plating solution was found to have encroached on the wired conductor beneath the resist in the areas around through-holes. A similar phenomenon was observed when the electroless copper plating was performed for 25 hours.

The sample showed good results in the test conducted for evaluating resistance to the heat of soldering whether it had been subjected to 15-h or 20-h plating.

EXAMPLES 40–52

Polyurethane acrylate (PUA-1) was obtained as in Example 1 and this polyurethane acrylate (PUA-1) was mixed with a linear polymer, photopolymerization initiator and a heterocyclic nitrogenous compound in the proportions shown in Table 5 so as to make light-sensitive resin compositions in accordance with examples of another aspect of the present invention. The numerals in Table 5 denote parts by weight. Using methyl ethyl ketone as a solvent, resin solutions (40–60% in concentration) were prepared. They were applied onto a polyethylene terephthalate film and dried with heat to obtain light-sensitive elements according to another aspect of the present invention which had a layer of light-sensitive resin composition in a thickness of about 50 μm.

CHARACTERISTIC EVALUATION TESTS

The light-sensitive elements prepared in Examples 40–52 were subjected to characteristic evaluation tests which were the same as those onducted in Examples 30–39. During the electroless plating and subsequent treatments, the protective films did not experience any deterioration, swelling or peeling and showed satisfactory resistance.

The sample were also subjected to a test for evaluating their resistance to the heat of soldering. The protective films remained stable and no detectable cracking or peeling occurred. This shows that the light-sensitive elements tested will serve satisfactorily as solder masks in practical applications.

The results of Examples 40–52 are shown in Table 6.

COMPARATIVE EXAMPLE 7

Using the recipe shown in Table 5, a light-sensitive resin composition was obtained as in the Examples and a light-sensitive element was produced from this resin composition.

CHARACTERISTIC EVALUATION TESTS

Using the light-sensitive elements thus obtained, protective films were formed on a substrate as in the Examples and thereafter subjected to an electroless plating treatment and a test for evaluating resistance to the heat of soldering. After the electroless plating treatment, part of the surface of the protective film using the light-sensitive dry film prepared in Comparative Example 5 turned opaque and part of that opaque area separated from the substrate. In the test conducted for evaluating resistance to the heat of soldering, swelling was observed in the area where peeling occurred but the other areas remained unchanged. As these results show, the light-sensitive resin composition prepared in Comparative Example 5 was usable as a solder mask but unlike te light-sensitive resin composition according to another aspect of the present invention, it was difficult to use this comparative sample as a protective film in chemical plating.

The sample using the light-sensitive dry film of Comparative Example 7 performed satisfactorily in 15-h electroless copper plating. However, after 20-h electroless copper plating, the plating solution was found to have encroached on the wired conductor beneath the resist in the areas around through-holes. A similar phenomenon was observed when the electroless copper plating was performed for 25 hours.

The sample showed good results in the test conducted for evaluating resistance to the heat of soldering whether it had been subjected to 15-h or 20-h plating. However, after 25-h plating, the sample under test experienced resist peeling in the areas where encroachment of the plating solution had occurred.

TABLE 5

| Composition | 40 | 41 | 42 | 43 | 44 | 45 | 46 | 47 | 48 | 49 | 50 | 51 | 52 | Comparative Example 7 |
|---|---|---|---|---|---|---|---|---|---|---|---|---|---|---|
| PUA-1 | 65 | 60 | 55 | 50 | 45 | 40 | 50 | 50 | 50 | 50 | 50 | 50 | 50 | 50 |
| PMBMA (1) | 30 | 35 | 40 | 45 | 50 | 55 | 45 | 45 | 45 | 45 | 45 | 45 | 45 | 45 |
| Photopolymerization initiator (2) | 5 | 5 | 5 | 5 | 5 | 5 | 5 | 5 | 5 | 5 | 5 | 5 | 6 | 5 |
| BT (3) | 0.2 | 0.2 | 0.2 | 0.2 | 0.2 | 0.2 | — | — | 0.1 | 0.5 | 1.0 | 2.0 | 0.5 | 0 |
| BI (4) | — | — | — | — | — | — | 0.2 | — | — | — | — | — | — | 0 |
| 2ABS (5) | — | — | — | — | — | — | — | 0.2 | — | — | — | — | — | 0 |
| GX-6099 (6) | — | — | — | — | — | — | — | — | — | — | — | — | 12 | — |
| Sb$_2$O$_3$ | — | — | — | — | — | — | — | — | — | — | — | — | 6 | — |

(1) methyl methacrylate/butyl methacrylate/methacrylic acid (80/19/1) copolymer (Mw ≈ 120,000—)
(2) Michler's ketone/benzophenone (1/10) mixture
(3) benzotriazole
(4) benzimidazole
(5) coaminobenzothiazole
(6) tribromophenyl methacrylate (trade name of Dai-ichi Kogyo Seiyaku Co., Ltd.)

TABLE 6

| | Exposure necessary for patterning (mj/cm$^2$) | Electroless Cu plating (pH 12.5, 60° C.) | | | Resistance to the heat of soldering | |
|---|---|---|---|---|---|---|
| | | 15 h | 20 h | 25 h | 15 h plating | 25 h plating |
| Ex. | | | | | | |
| 40 | 180 | O.K. | O.K. | O.K. | O.K. | O.K. |
| 41 | 180 | O.K. | O.K. | O.K. | O.K. | O.K. |
| 42 | 160 | O.K. | O.K. | O.K. | O.K. | O.K. |
| 43 | 150 | O.K. | O.K. | O.K. | O.K. | O.K. |
| 44 | 140 | O.K. | O.K. | O.K. | O.K. | O.K. |
| 45 | 140 | O.K. | O.K. | O.K. | O.K. | O.K. |
| 46 | 140 | O.K. | O.K. | O.K. | O.K. | O.K. |
| 47 | 150 | O.K. | O.K. | O.K. | O.K. | O.K. |
| 48 | 130 | O.K. | O.K. | O.K. | O.K. | O.K. |
| 49 | 150 | O.K. | O.K. | O.K. | O.K. | O.K. |
| 50 | 180 | O.K. | O.K. | O.K. | O.K. | O.K. |
| 51 | 200 | O.K. | O.K. | O.K. | O.K. | O.K. |
| 52 | 150 | O.K. | O.K. | O.K. | O.K. | O.K. |
| Comparative Ex. | | | | | | |
| 5 | 130 | encroachment of plating solution | turned opaque | turned opaque | O.K. | peeling |
| 7 | 140 | O.K. | encroachment of plating solution | encroachment of plating solution | O.K. | peeling |

INDUSTRIAL APLICABILITY

The light-sensitive resin composition of the present invention has resistance to heat and chemicals and is particularly adapted for use in the formation of a protective film for chemical plating. This composition is also applicable to the manufacture of printed circuit boards by the additive process.

We claim:

1. A light-sensitive resin composition which contains:
(a) a multivalent aromatic polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

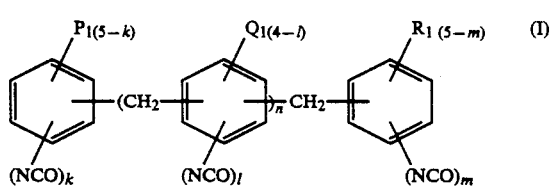

(where k is 1 or 2, l is 1 or 2, m is 1 or 2, $P_{1(5-k)}$ is a hydrogen atom or a methyl group $Q_{1(4-l)}$ is a hydrogen atom or a methyl group, $R_{1(5-m)}$ is a hydrogen atom or a methyl group, and n is an integer of 0–20);

(b) a linear high-molecular weight compound; and (c) a polymerization initiator which generates free radicals upon exposure to light.

2. A light-sensitive element having a light-sensitive resin composition layer on a support, said layer being formed of a light-sensitive resin composition which contains:

(a) a multivalent aromatic polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

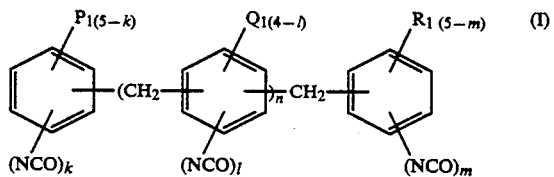

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(b) a linear high-molecular weight compound; and (c) a polymerization initiator which generates free radicals upon exposure to light.

3. A light-sensitive resin composition which contains:

(a) 10–60 parts by weight of a polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

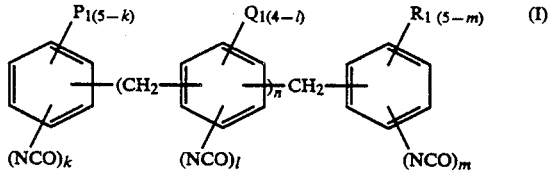

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(aa) 5–45 parts by weight of a bisphenol type epoxy (meth)acrylate;

(b) 20–60 parts by weight of a linear high-molecular weight compound; and (c) a polymerization initiator which generates free radicals upon exposure to light, provided that the sum of (a)+(aa) and (b) is 100 parts by weight.

4. A light-sensitive element having a layer of light-sensitive resin composition on a support, said light-sensitive resin composition containing:

(a) 10–60 parts by weight of a polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

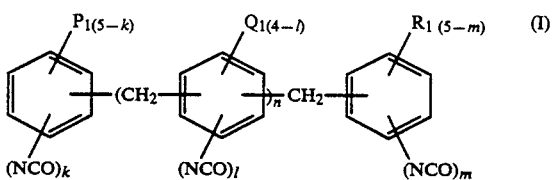

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(aa) 5–45 parts by weight of a bisphenol type epoxy (meth)acrylate;

(b) 20–60 parts by weight of a linear high-molecular weight compound; and (c) a polymerization initiator which generates free radicals upon exposure to light, provided that the sum of (a)+(aa) and (b) is 100 parts by weight.

5. A light-sensitive resin composition which contains:

(a) a polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

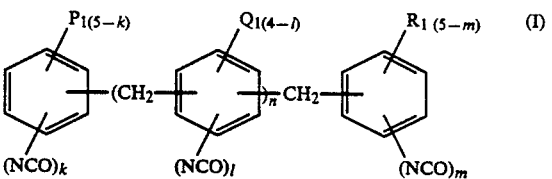

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(b) a linear high-molecular weight compound; and (c) a polymerization initiator which generates free radicals upon exposure to light; and (d1) at least one of tetrazole and derivatives thereof.

6. A light-sensitive resin composition which contains:

(a) a polyurethane poly (meth)acrylate having at least two (meth)acryloyl groups and at least two urethane bonds in one molecule and which is obtained by reacting a (meth)acrylate monoester of a dihydric alcohol with a polyvalent aromatic isocyanate represented by the general formula:

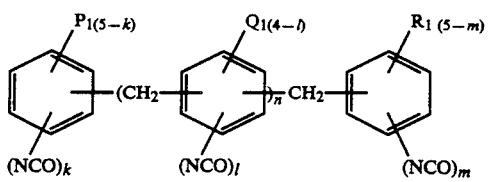 (I)

(where k is 1 or 2, l is 1 or 2, m is 1 or 2, $P_{1(5-k)}$ is a hydrogen atom or a methyl group, $Q_{1(4-l)}$ is a hydrogen atom or a methyl group, $R_{1(5-m)}$ is a hydrogen atom or a methyl group, and n is an integer of 0–20);

(b) a linear high-molecular weight compound;

(c) a polymerization initiator which generates free radicals upon exposure to light; and (d2) a heterocyclic nitrogenous compound represented by the general formula:

 (II)

(where T is an ortho-aromatic hydrocarbon group; X is $CH_2$, NCl, NY, S, O or Se; Z is N or C-Y; Y is H, $NH_2$, an alkyl group having 1–4 carbon stoms, or a halogen).

* * * * *

UNITED STATES PATENT AND TRADEMARK OFFICE
CERTIFICATE OF CORRECTION

PATENT NO. : 4,988,605

DATED : January 29, 1991

INVENTOR(S) : Shigeru Kubota, Katsue Masui, Toshimoto Moriwaki and Torahiko Andou It is certified that error appears in the above-identified patent and that said Letters Patent is hereby corrected as shown below:

On the title page of the patent under the designation of Assignee, record [73], please add in addition to the assignee set forth thereat, the following second assignee:

Mitsubishi Rayon Company, Limited

Signed and Sealed this

Twenty-seventh Day of October, 1992

*Attest:*

DOUGLAS B. COMER

*Attesting Officer*     Acting Commissioner of Patents and Trademarks